United States Patent [19]

Yamamoto et al.

[11] Patent Number: 4,962,415
[45] Date of Patent: Oct. 9, 1990

[54] IC CARD

[75] Inventors: Hiroshi Yamamoto; Ryutaro Arakawa; Akio Anada, all of Ibaraki, Japan

[73] Assignee: Hitachi Maxell, Ltd., Ibaraki, Japan

[21] Appl. No.: 477,197

[22] Filed: Feb. 6, 1990

Related U.S. Application Data

[63] Continuation of Ser. No. 131,441, Dec. 11, 1987, abandoned.

[30] Foreign Application Priority Data

Dec. 15, 1986 [JP] Japan ................. 61-296715

[51] Int. Cl.[5] ............... H01L 23/12; H01L 23/04; H01L 23/14; H01L 23/28
[52] U.S. Cl. ............................... 357/74; 357/72; 357/80; 235/492; 235/487
[58] Field of Search ............. 357/84, 85, 74, 80, 357/72; 235/488, 489, 490, 491, 492, 493, 494

[56] References Cited

U.S. PATENT DOCUMENTS

| 4,447,716 | 5/1984 | Aigo | 357/84 |
| 4,649,418 | 3/1987 | Uden | 357/74 |
| 4,682,017 | 7/1987 | Nakahara et al. | 235/492 |
| 4,725,924 | 2/1988 | Juan | 357/80 |
| 4,731,645 | 3/1988 | Parmentier et al. | 357/85 |
| 4,731,700 | 3/1988 | Woodward et al. | 357/80 |

Primary Examiner—Rolf Hille
Assistant Examiner—S. V. Clark
Attorney, Agent, or Firm—Antonelli, Terry, Stout & Kraus

[57] ABSTRACT

An IC card is provided in which an IC chip is packaged in an opening formed in the IC card. One surface of the IC chip is laid on a film substrate on which external contact terminals are formed, and the other surface is covered with a reinforcing plate, the IC chip. The film substrate and the reinforcing plate are formed integrally in a thin plate-like module which is well-fitted in the above-mentioned opening while the external contact terminals on the film substrate are exposed externally.

18 Claims, 2 Drawing Sheets

IC CARD

This application is a continuation of application Ser. No. 131,441, filed on Dec. 11, 1987, now abandoned.

BACKGROUND OF THE INVENTION

1. Field of the Invention

The present invention relates to an IC card and, more particularly, to an IC card which is produced by packaging a semiconductor chip mounted on a film substrate.

2. Description of the Prior Art

Such IC cards have already been put into practical use as having an IC chip such as a semiconductor memory chip (referred to simply as memory chip, hereinunder) or a microcomputer chip packaged on card-type substrates and having memory or computing function.

Briefly, such a known IC card has a comparatively thick wiring substrate and an IC chip mounted on the substrate, the substrate and the IC chip being integrated together with contact terminals so as to form a module-type construction.

FIG. 6 is a sectional view of an essential portion of an IC card produced by a known method. The IC card has a microcomputer chip 1, a memory chip 1', connecting bonding pads 2, 2', bonding wires 3, bonding lead 4, second wiring layer 4', through-holes 5, 5', external contact terminals 6, a wiring substrate 7, resin 8, an IC card center core sheet 9, and an IC card overlay 10.

As will be seen from this Figure, the microcomputer chip 1 and the memory chip 1' are fixed in recesses formed in the multi-layer wiring substrate 7. The bonding pads 2, 2' are connected to the bonding lead 4 through the bonding wires 3. The wiring substrate has three layers: namely, a first wiring layer which constitutes the bonding lead 4, the second wiring layer 4' mentioned above and a third wiring layer which provides externally contact terminals 6. The first wiring layer and the second wiring layer are connected to each other by the through holes 5, while the through holes 5' provide connection between the second wiring layer 4' and the third wiring layer which provides the externally contact terminals 6. The externally contact electrodes 6 are adapted to contact with external terminals on an IC card reader or writer so as to enable the IC card to conduct signal exchange with the IC card reader or writer and to be supplied with electric power.

The wiring substrate 7 having the microcomputer chip 1 and the memory chip 1' are sealed with a resin such as an epoxy resin such that the resin fills the recesses receiving the IC chips and that the resin covers these IC chips, thus presenting a module construction. This module is mounted in a window formed in the center core sheet 9 of the IC card, and the overlay 10 is formed to cover the center core, sheet 9, thus completing the IC card. The externally contact terminals 6, 6 are not covered by the overlay 10 but are exposed for external contact.

In this known IC card, since there are two IC chips, i.e., the microcomputer chip and the memory chip, the wiring construction of the wiring substrate is complicated to require a multi-layer structure. Each IC chip and the wiring substrate are interconnected by a ball bonding method with Au wire, so that the bonding height could not be lower, with the result that the thickness of the module and, hence, the thickness of the IC card are increased.

SUMMARY OF THE INVENTION

Accordingly, an object of the present invention is to provide an IC card which has a simplified construction and reduced module thickness and which is reliable and inexpensive, thereby obviating the problems encountered by the known IC cards having complicated substrate structures.

To this end, according to the present invention, the IC chips to be mounted on the IC card are preferably formed as a single chip such as a one-chip microcomputer, and the connection between the single chip and the substrate is conducted by film carrier method (tape-automated bonding method), while making use of the film carrier itself as the wiring substrate (referred to as "film substrate" hereinafter).

The formation of a single chip including a plurality of IC chips reduces the number of wirings required and, therefore, simplifies the construction of the wiring substrate. This in turn enables the tape carrier method to be applied in wiring the IC chip. In addition, the thickness of the module is remarkably reduced by the fact that the film carrier itself is utilized as the wiring substrate. The reduced thickness makes it possible to incorporate a suitable reinforcing plate having a large rigidity, so as to protect the module against external force.

The above and other objects, features and advantages of the present invention will become clear from the following description of the preferred embodiment when the same is read in conjunction with the accompanying drawings.

DESCRIPTION OF THE PREFERRED EMBODIMENT

A preferred embodiment of the present invention will be described hereinunder with reference to the drawings.

Figure 1:
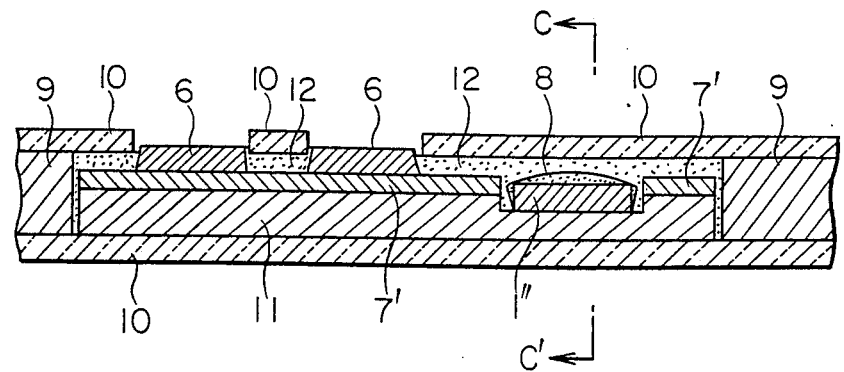
FIG. 1 is a sectional view of an essential portion of an IC card in accordance with the present invention.
Figure 2:
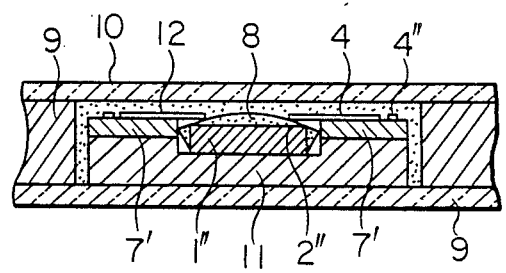
FIG. 2 is a sectional view of the essential portion of the IC card taken along the line C—C of FIG. 1.

Referring first to FIG. 1, an IC card in accordance with the present invention has an IC chip 1" constituted by a one-chip microcomputer, external contact terminals 6, 6, a film substrate 7', a resin 8, an IC card center core sheet 9, an overlay 10, a reinforcing plate 11 and adhesive 12. Referring now to FIG. 2 which is a sectional view of the IC card taken along the line C—C in FIG. 1, a reference numeral 2" denotes an aluminum pad formed on the electrodes of the IC chip, 4 denotes a connecting terminal, and 4" denotes a wiring. Other numerals appearing in FIG. 2 denote the same parts as those in FIG. 1.

The IC chip constituted by the one-chip microcomputer 1" used in the IC card shown in FIGS. 1 and 2 has a length and a width which range, respectively, between 3 mm and 8 mm and a thickness which ranges between 200 and 350 μm. The one-chip microcomputer 1″ is connected by a film substrate 7′ which is a film-type substrate with a conductor pattern formed thereon.

A film which is ordinarily used in tape carrying method having a width of 35 mm and a thickness ranging between 50 and 250 μm can be used as the film substrate. On the other hand, the ISO standard requires that IC cards have a thickness of 0.76 mm. In order to meet this requirement while facilitating the mounting of the IC chip 1″ on the film substrate 7′, the film used as the film substrate 7′ preferably has a thickness which ranges between 100 and 150 μm. The material of the film substrate may be a glass-fiber-reinforced epxoy resin, polyimide resin, polyethylene terephthalate resin or the like.

A plurality of one-chip microcomputers 1″ are successively bonded onto a long continuous film substrate and the film substrate is cut into sections each carrying one of the bonded one-chip microcomputers 1″. Each section is fitted together with the reinforcing plate 11 in a window formed in the center core sheet 9 of the IC card. The window may have the form of an aperture or a recess formed in the center core 9. Formation of the window in the form of a recess is difficult as compared with the window in the form of an aperture. The window in the form of a recess, however, is advantageous in that it makes it possible to neglect the overlay on the surface of the center core sheet 9 which is devoid of the recess. The center core sheet 9 is made from a resin. In order to meet the requirement of ISO standard. for IC cards, the center core sheet 9 is preferably made from polyvinyl chloride having a thickness of 0.42 to 0.52 mm.

Figure 3:
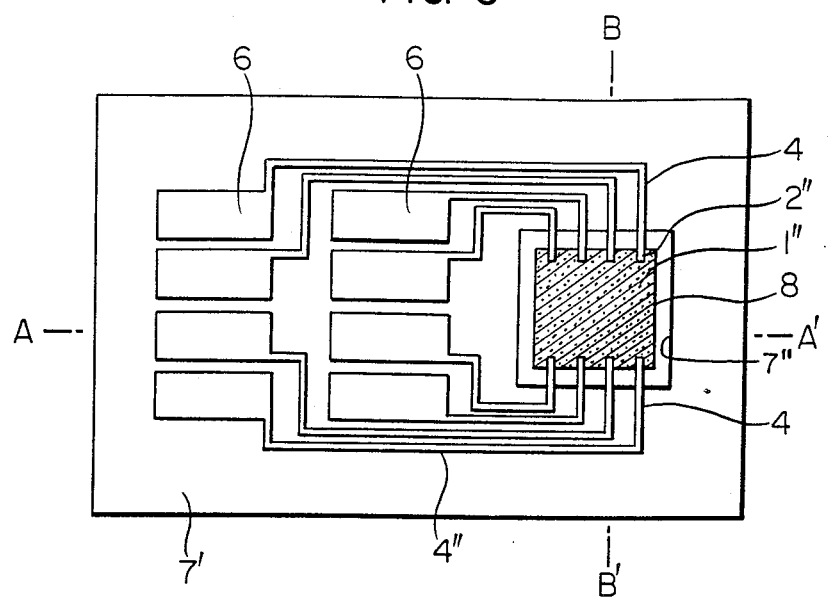
FIG. 3 is a top plan view of a film substrate carrying an IC chip to be packaged in an IC card of the present invention.

FIG. 3 is a top plan view of a film substrate mounting an IC chip to be packaged in the IC card of the present invention. In this Figure, the same reference numerals are used to denote the same parts or members as those appearing in FIGS. 1 and 2. Lines A—A′ and B—B′ correspond, respectively, to the sections shown in FIGS. 1 and 2.

Referring to FIG. 3, the film substrate 7′ has a wiring 4″ formed thereon, as well as bonding leads 4, 4 and external contact terminals 6, 6 formed on the wiring 4″. The external contact terminals 6, 6 are formed by piling up Cu, Ni and Au on the conductor formed on the film substrate.

The IC chip (one-chip microcomputer) 1″ is, placed in an aperture formed in the film substrate 7″ and the aluminum pad on the IC chip 1″ is bonded to the bonding leads 4, 4. A potting with a resin 8 is conducted so as to cover the bonding area. The thus formed structure is then reinforced by the reinforcing plate 11 so as to form a module. This module is packaged in the IC card such that the external contact electrodes 6, 6 are exposed to the exterior of the package.

The module having the construction shown in FIG. 3 is mounted in the window of the center core sheet 9 of the IC card as shown in FIGS. 1 and 2, and the gaps between the edges of the window and the module are filled with a suitable material such as an epoxy resin. Then, an overlay 10 made of, for example, polyvinyl chloride and having a thickness of 100 to 150 μm is formed on each side of the IC card including the module. Needless to say, the overlay 10 is formed in such a way as to allow the external contact terminals 6, 6 to be exposed to the exterior. Preferably, the surfaces of the external contact terminal 6, 6 are positioned 100 μm below the surface of the overlay 10 at the lowest and flush with the surface of the overlay 10 at the highest.

A stainless steel sheet is preferably used as the reinforcing plate in the IC card of the present invention, although other suitable materials such as a sheet of a metal, e.g., copper or a copper alloy and nickel or a nickel alloy, and a sheet of ceramics may be used.

The thickness of the reinforcing plate 11 preferably ranges between 0.1 and 0.5 mm and more preferably between 0.2 and 0.3 mm. As shown in FIGS. 1 and 2, for the purpose of further reducing the thickness of the module, it is advisable to form a recess in the reinforcing plate 11 and to place the IC chip 1″ in this recess. It will be understood that, since the IC chip 1″ is rigidly reinforced by the reinforcing plate, the IC card exhibits a greater resistance against any damaging external force and, hence, a higher reliability.

In a preferred form of the present invention, the copper lead 4 is plated with Sn, and the electrode adjacent to the IC chip 1″ is metallized to form a gold bump. Then, the copper lead 4 and the electrode are connected by gang bonding. Subsequently, the junction between the lead 4 and the electrode is covered with an epoxy resin which forms a protecting layer. This, however, is not exclusive and the arrangement may be such that the bump is not formed on an aluminum pad electrode while the bonding lead 4 is plated with gold. In such a case, the connection between the aluminum pad and the bonding with gold plating 4 is attained by gold-aluminum bonding. The epoxy resin layer 8 serving as the above-mentioned protecting layer may be dispensed with, because a satisfactory protecting effect is produced by the resin which is charged into the window for receiving the IC chip of the IC card.

The resin which is charged into the IC-chip-mounting window of the IC card for the purpose of fixing the IC, film substrate and the reinforcing plate may be a thermocuring epoxy resin, as well as a photocuring resin. Preferably, however, the IC card of the present invention has both the protecting layer 8 of epoxy resin and the photocuring resin 12, because the epoxy resin effectively prevents moisture from coming into the IC card while the photocuring resin can be set in a short time with reduced contraction or expansion.

A description will be made hereinunder as to the advantage of the IC card of the invention which employs a film substrate formed by tape carrier method over the known IC card which employs a wiring substrate relying upon wire bonding method.

Figure 4:
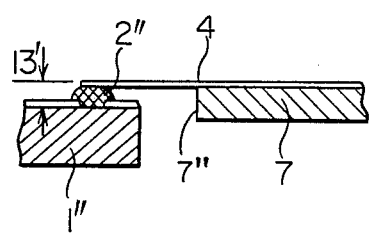
FIG. 4 is an enlarged view illustrating the manner in which an IC chip is mounted on a film substrate used in the IC card of the present invention.

FIG. 4 is a fragmentary view of an essential portion of the IC card of the invention, illustrating particularly the manner in which the IC chip is mounted on the film substrate. In this Figure, a reference numeral 1″ denotes the IC chip, 2″ denotes the bump formed on the IC chip, 7′ denotes the film substrate, 4 denotes the bonding lead leading from the wiring formed on the film substrate, and 13′ represents the bonding height.

Figure 5:
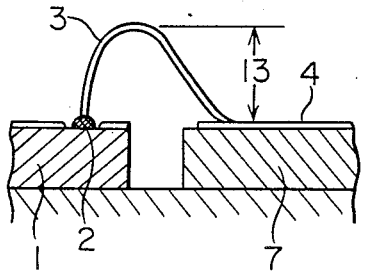
FIG. 5 is an enlarged view illustrating the manner in which an IC chip is mounted on a wiring substrate used in a known IC card.
Figure 6:
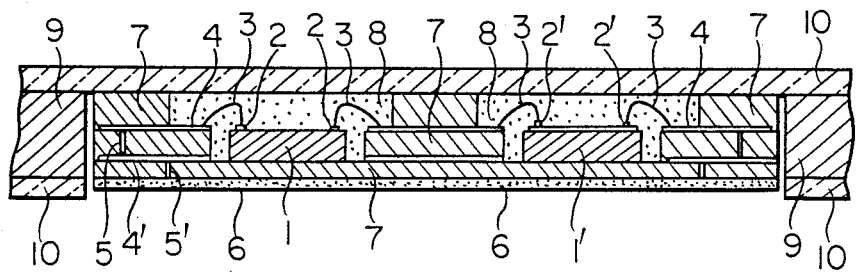
FIG. 6 is a sectional view of an essential portion of a known IC card.

FIG. 5 is a fragmentary view of an essential portion of the known IC card illustrating particularly the manner in which the IC chip is mounted on the wiring substrate. In this Figure, a reference numeral 1 denotes the IC chip, 2 denotes the bonding pad on the IC chip, 3 denotes the bonding wire, 4 denotes the bonding lead formed on the wiring substrate, and 13 represents the bonding height.

As will be seen from FIG. 4, it is possible to reduce the bonding height 13′ to a level of, for example, 50 μm or less, by effect of the use of the film substrate. In contrast, in the known IC card as shown in FIG. 5, the bonding height 13 is as high as 130 to 200 μm, because the connection between the bonding pad 3 of the IC chip 1 and the wiring substrate 7 is attained by ball bonding.

Thus, in the IC card of the present invention, the module to be packaged can be formed with a remarkably reduced thickness so that a thickness margin of 80 to 150 μm can be obtained with respect to the thickness of the IC card which is 0.76 mm as the standard. This thickness margin can effectively be used as a space for installing the reinforcing plate which effectively protects the module structure and the IC chip from external force. Since the reinforcing plate and the center core sheet in cooperation provides a box-type structure which receives the IC chip, so that a reinforcing effect which is greater than that produced by the reinforcing plate alone can be attained.

As will be understood from the foregoing description, according to the present invention, IC chips to be packaged are constructed as a single chip such as one-chip microcomputer so that the number of IC chip terminals is reduced. The IC thus having reduced number of terminals is mounted through film carrier method which makes use of a film substrate so that the thickness of the module to be packaged can be reduced. The reduced thickness of the module allows a reinforcing plate to be installed. It is, therefore, possible to obtain an IC card which exhibits a large resistance to external damaging force and, hence, a high reliability, while remarkably reducing the production cost.

Although the invention has been described through its preferred form, the described embodiment is only illustrative and various changes and modifications may be imparted thereto without departing from the scope of the invention which is limited solely by the appended claims.

For instance, although the described embodiment employs a one-chip-type IC in which a microcomputer chip (CPU) and a memory chip are integrated, the invention does not exclude separate installation of these two IC chips in a single IC card. It is also to be understood that the provision of the overlay 10 on one or both sides of the IC card is not essential.

What is claimed is:

1. An IC card for transmitting and receiving signals to and from an external apparatus, said IC card including a card-type base having therein a window, a module disposed in said window, and resin provided in a space defined between said module and said window in said card-type base, said module further comprising:
   a film substrate having an aperture and top and bottom surfaces;
   an IC chip located in said aperture, said IC chip having top and bottom surfaces;
   a reinforcing plate supporting said film substrate and said IC chip;
   a wiring formed on the stop surface of said film substrate;
   external contact terminals incorporated integrally with said wiring to permit connection to said external apparatus; and
   bonding leads extending from said wiring toward said aperture in said film substrate,
   wherein said IC chip is arranged so that the bottom surface of said IC chip is located on said reinforcing plate and adjacent to said bottom surface of said film substrate, wherein said reinforcing plate is bonded to said bottom surface of said film substrate so as to cover said aperture in said film substrate, and wherein said module is embedded in said resin so that said external connecting terminals are exposed at least in part, externally from said card-like base and, further wherein said reinforcing plate is comprised of a sheet material having a thickness of 0.1 to 0.5 mm, wherein said IC chip has a thickness of 200 to 350 μm and wherein said film substrate has a thickness of 50 to 250 μm.

2. An IC card according to claim 1, wherein said window is an aperture.

3. An IC card according to claim 1, wherein said window is a recess.

4. An IC card according to claim 1, wherein an overlay is provided on the surface of said card-type base having said externally contact terminals, such that said overlay does not cover said externally contact terminals.

5. An IC card according to claim 1, wherein said IC chip is a one-chip microcomputer.

6. An IC card according to claim 1, wherein said IC chip is mounted on said film substrate by tape carrier method.

7. An IC card according to claim 1, wherein said reinforcing plate is made of a sheet of a metal.

8. An IC card according to claim 1, wherein the portion of said reinforcing plate corresponding to said IC chip is recessed so as to receive said IC chip.

9. An IC card according to claim 4, wherein the space defined by said window in said card-type base and said overlay and receiving said film substrate and said reinforcing plate is filled with a resin.

10. An IC card according to claim 4, wherein the surface of said externally contact terminals is positioned at a level 100 μm below the surface of said overlay at the lowest and flush with the surface of said overlay at the highest.

11. An IC card according to claim 1, wherein said film substrate is made of a material selected from a group consisting of glass-fiber-reinforced epoxy resin, polyimide resin and polyethylene terephthalate resin.

12. An IC card according to claim 4, wherein said overlay has a thickness which is not smaller than 100 μm but not greater than 150 μm.

13. An IC card according to claim 1, wherein said externally connecting terminal has an uppermost layer of gold.

14. An IC card according to claim 13, wherein said externally connecting terminal has a copper layer, a nickel layer and a gold layer.

15. An IC card according to claim 1, wherein the top surface of said IC chip carrying elements of said IC chip is covered by an epoxy resin layer.

16. An IC card according to claim 9, wherein said resin filling said space defined by said window in said card-type base and said overlay and receiving said film substrate and said reinforcing plate is a resin selected from a group consisting of a thermocuring epoxy resin and a photocuring resin.

17. An IC card according to claim 1, wherein said resin filled in said window in said card-like base is made of a resin material selected from a group consisting of thermocuring epoxy-resin and photocuring resin.

18. An IC card according to claim 1, wherein said IC card has an overall maximum thickness of 0.76 mm or less.

* * * * *